Nov. 5, 1963 J. W. EDENS ETAL 3,110,003

TUNING CIRCUIT WITH SERIALLY CONNECTED PRINTED AND WIRE WOUND INDUCTANCES TO MINIMIZE FREQUENCY DRIFT

Filed Nov. 3, 1959

INVENTOR
Jan wigbolt edens
heiko broekema
BY
Frank R. Trifari
AGENT

United States Patent Office 3,110,003
Patented Nov. 5, 1963

3,110,003

TUNING CIRCUIT WITH SERIALLY CONNECTED PRINTED AND WIRE WOUND INDUCTANCES TO MINIMIZE FREQUENCY DRIFT

Jan Wigbolt Edens and Heiko Broekema, Emmasingel, Eindhoven, Netherlands, assignors to North American Philips Company Inc., New York, N.Y., a corporation of Delaware Filed Nov. 3, 1959, Ser. No. 850,725
Claims priority, application Netherlands Nov. 3, 1958
3 Claims. (Cl. 334—6)

This invention relates to tuning circuits for receivers operating on the superheterodyne principle and intended more particluarly for the reception of signals originating from television transmitters or other short-wave transmitters, in which it is possible to tune to reception in the various frequency ranges by switching-over an inductance of the tuning circuit and in which, if desired, it is also possible to tune continuously to the ranges of said transmitters by means of a capacitor of variable capacity.

The various frequency ranges are chosen more particularly by changing an inductance coil of the oscillator circuit. It is then frequently necessary to utilise fine tuning by means of which the oscillator frequency may be varied within determined narrow limits. If, for example, the receiver is a television receiver, it may thus be ensured that the television signal together with the audio-band, after frequency transformation is situated with respect to the pass range of the intermediate-frequency bandpass filter so that optimum reproduction is obtained.

Such tuning circuits are usually subjected to a certain frequency drift. This frequency drift is attributable inter alia to variations in the circuit elements due to the action of temperature and moisture. The resulting relative variations in tuning frequency are then approximately equal for the various frequency ranges, but the absolute variations and hence the frequency drift are greater for the higher frequency ranges than for the lower frequency ranges.

This disadvantage applies more particularly to the oscillator circuit.

In addition, such tuning circuits can usually be trimmed with difficulty only.

An object of the invention is to mitigate these disadvantages. The tuning circuit according to the invention for this purpose is characterized in that in series with the commutatable inductance there is connected another inductance which is large with respect to the value of the commutatable inductance for those frequency ranges which are located highest in frequency.

Figure 1:
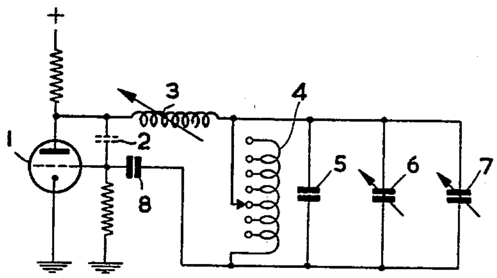
Figure 2:
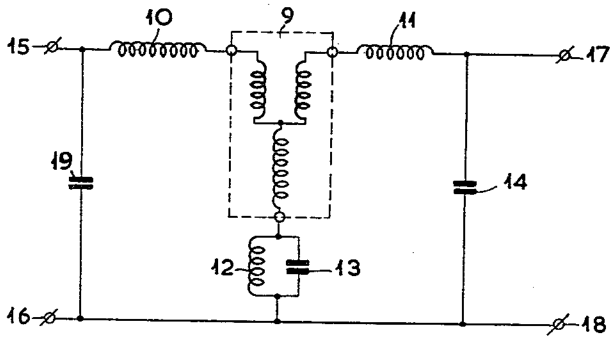

In order that the invention may be readily carried into effect, it will now be described in detail, by way of example, with reference to the accompanying drawings, in which:

FIGURE 1 shows the local oscillator comprising a tuning circuit according to the invention, and FIGURE 2 shows a tuning circuit according to the invention suitable for the high-frequency bandpass filter of the receiver.

FIGURE 1 shows the local oscillator of a receiver operating on the superheterodyne principle. Reference numeral 1 indicates the oscillator tube, the anode-grid capacity 2 of which, together with the series-combination of an inductance 3, an inductance 4, which latter is bridged by the parallel combination of capacitors 5, 6 and 7, and a capacitor 8 constitutes the tuning circuit.

Inductance 4 is the commutatable inductance which is replaced upon passing from one frequency band to another.

The capacitor 5 is fixed. The value of the capacity is dependent to a certain extent upon temperature so that compensation of variations in termerature is obtained.

The capacitor 6 is adjustable and serves to adjust the tuning circuit.

The capacitor 7 is variable and serves for the fine tuning of the tuning circuit. The capacity of this capacitor is preferably several times smaller than the capacity formed by the parallel combination of capacitors 5 and 6, so that a variation in the position of capacitor 7 only results in a slight variation in the total capacity of the circuit.

The capacitor 8 is a coupling capacitor, the value of which likewise shows a certain extent of dependency upon temperature.

The inductance 4 is adjustable and also serves to adjust the tuning circuit.

This inductance has a high value with respect to the inductance 4 for those frequency ranges which are located highest in frequency. If, for example, the receiver is intended for the reception of television signals, a group of channels is located between 47 mc./s. and 68 mc./s. and a group of channels is located between 174 mc./s. and 216 mc./s. For the frequency ranges of the last-mentioned group of channels, the inductance 4 is comparatively small, that is to say smaller as the relevant frequency range is located higher in frequency.

As previously explained, the frequency drift of a circuit in the absoltue sense is fundamentally greater for higher frequency ranges than for lower frequency ranges. More particularly if the commutatable inductances are of the printed circuit type, in which a pattern of conductors is provided on an insulating carirer, the frequency drift may have an interfering character.

According to the invention, the inductance 3 is chosen so that, for the higher channels, the inductance 4 constitutes substantially a short-circuit for the parallel combination of the capacitors 5, 6 and 7. This affords the advantage, that the influence of inductance 4 upon the frequency determined by the tuning circuit is very small and that this frequency is substantially determined by the inductance 3 which is usually not of the printed circuit type, but preferably designed as a wire-wound coil and hence is considerably less dependent upon influences of moisture and temperature.

For the lower channels, the inductance 4 which is greater for these channels according as the relevant channel lies lower in frequency, naturally plays a greater part for the tuning frequency, but in this case the frequency drift is by nature considerably less.

The choice of the capacitors 5 and 8 which, due to their depedency upon temperature, bring about a compensation for variations in temperature and hence exert a drift-decreasing influence upon the tuning circuit, has thus also become very simple, since in the higher channels substantially only capacitor 8 is active and may thus have an optimum value for these channels independently of capacitor 5. In the lower channels, both capacitors are active, but since capacitor 8 is already determined, only capacitor 5 need still be chosen without having regard to the influence of this capacitor upon the frequency ranges located higher in frequency.

The said choice of the inductances also has a favourable influence upon the fine tuning. In this case also, a variation in capacity 7 results by nature in a much greater absolute variation in frequency as the relevant frequency range is higher. By providing for this fine tuning to take place by means of a capacitor connected parallel to the commutatable inductance 4 which, for the higher frequency ranges, has a comparatively low value with respect to the inductance 3 and hence has a comparatively small influence upon the tuning frequency, it is achieved that the relative variations in frequency in the higher frequency ranges are smaller than the relative frequency variations in the lower frequency ranges upon variation of capacitor 7, with the result that the range of fine tuning is highly independent of the frequency range in which fine tuning takes place.

If, in addition, the inductance 3 is chosen so as to be small with respect to the value of inductance 4 for the lower channels, the adjustment of the tuning circuit also becomes very simple. Adjustment of capacitor 6 influences the tuning frequency of both the lower channels and the higher channels. Adjustment of inductance 3, however, substantially influences the higher channels, since due to the inductance 4 for the lower channels being high with respect to inductance 3, the influence of 3 upon these channels is small. However, the inductance 3 has a great influence upon the adjustment of the higher channels, since in these channels the inductance 4 is very small. Consequently, in trimming the tuning circuit, the following procedure is followed. The lower channels are adjusted by means of capacitor 6, irrespective of the adjustment of inductance 3. This adjustment also exerts influence upon the tuning of the higher channels, but since a subsequent adjustment of the higher channels by means of inductance 3 has no influence upon the adjustment of the lower channels, re-adjustment of capacitor 6 is not necessary.

FIGURE 2 shows diagrammatically a tuning circuit for the high-frequency bandpass filter of the receiver. 9 indicates a commutatable section of an inductance. In addition, inductances 10, 11, 12 and capacitors 13, 14 and 19 form parts of the said filter. 10 and 11 indicate the inductances having high values with respect to the inductance of the inductance section 9, as viewed from the input terminals 15, 16 and from the output terminals 17, 18 respectively, for the higher frequency ranges. Such a tuning circuit has favourable properties in regard to frequency drift and adjustment for the same reasons as has the tuning circuit shown in FIGURE 1. In view thereof, it is again preferable for the values of the inductances 10 and 11 to be chosen small with respect to the inductance of the inductance section 9, as viewed from the input terminals 15, 16 and from the output terminals 17, 18 respectively, for the lower frequency ranges.

It will be evident that the invention is applicable to an input circuit of the receiver in an analogous manner as shown in FIGURE 2.

What is claimed is:

1. A tuning circuit for a receiver adapted to selectively receive signals of first and second frequency ranges, the frequencies of said second range being substantially higher than the frequencies of said first range, said tuning circuit comprising commutatable printed circuit inductance means for selectively tuning said receiver to said ranges, said commutatable inductance means comprising a pattern of inductors on an insulating carrier, and non-commutatable inductance means connected in series with said commutatable means comprising a wire wound coil, the inductance of said non-commutatable inductance means being large with respect to the inductance of said commutatable inductance means for frequencies of said second range, and small with respect to the inductance of said commutatable inductance means for frequencies of said first range, and capacitor means connected in parallel with said commutatable inductance.

2. The tuning circuit of claim 1, in which said capacitor connected in parallel with said commutatable inductance means is an adjustable capacitor.

3. The tuning circuit of claim 2, in which a temperature dependent capacitor is connected in parallel with said commutatable inductance means.

References Cited in the file of this patent

UNITED STATES PATENTS

| | | |
|---|---|---|
| 2,531,434 | Holland et al. | Nov. 28, 1950 |
| 2,581,159 | Achenbach | Jan. 1, 1952 |
| 2,611,807 | Lazzery | Sept. 23, 1952 |
| 2,728,818 | Mackey et al. | Dec. 27, 1955 |
| 2,729,746 | Pan | Jan. 3, 1956 |
| 2,756,335 | Snyder | July 24, 1956 |
| 2,798,158 | Horowitz | July 2, 1957 |
| 2,816,221 | Edens et al. | Dec. 10, 1957 |